(12) United States Patent
Lu et al.

(10) Patent No.: US 7,596,234 B2
(45) Date of Patent: Sep. 29, 2009

(54) METHOD AND APPARATUS FOR PLAYBACK OF AUDIO FILES

(75) Inventors: Phillip Lu, Kirkland, WA (US); Kipley J. Olson, Mercer Island, WA (US)

(73) Assignee: Microsoft Corporation, Redmond, WA (US)

( * ) Notice: Subject to any disclaimer, the term of this patent is extended or adjusted under 35 U.S.C. 154(b) by 820 days.

(21) Appl. No.: 10/658,349

(22) Filed: Sep. 9, 2003

(65) Prior Publication Data
US 2004/0264715 A1 Dec. 30, 2004

Related U.S. Application Data

(63) Continuation-in-part of application No. 10/606,464, filed on Jun. 26, 2003, now Pat. No. 7,272,235.

(51) Int. Cl.
*H04B 1/00* (2006.01)
(52) U.S. Cl. .............................. 381/119; 369/3; 84/625; 84/660
(58) Field of Classification Search ................. 381/119, 381/104, 106–107; 700/94, 4; 369/3; 84/625, 84/660
See application file for complete search history.

(56) References Cited

U.S. PATENT DOCUMENTS

| | | | |
|---|---|---|---|
| 4,434,325 A * | 2/1984 | Kobayashi et al. | .......... 381/104 |
| 5,289,546 A | 2/1994 | Hetherington | |
| 5,890,017 A | 3/1999 | Tulkoff et al. | |
| 6,259,793 B1 * | 7/2001 | Washio et al. | ................ 381/119 |
| 6,317,776 B1 | 11/2001 | Broussard et al. | |
| 6,498,855 B1 | 12/2002 | Kokkosoulis et al. | |
| 6,534,700 B2 * | 3/2003 | Cliff | ............................ 84/603 |
| 6,807,450 B1 * | 10/2004 | Takenaka et al. | ............... 700/94 |
| 7,072,477 B1 | 7/2006 | Kincaid | |
| 7,189,913 B2 * | 3/2007 | Moulios et al. | ................ 84/612 |
| 2004/0005068 A1 | 1/2004 | Zeevi et al. | |

OTHER PUBLICATIONS

Cohen, et al; "Automatic Amplitude Normalization Of Speech"; IBM Technical Disclosure Bulletin: Vo. 16, No. 8; Jan. 1974; pp. 2610-2611.
Penfold; "Stero Automatic Fader"; Practical Wireless; Apr. 1980; pp. 24-51.
Edwards; "Easy-to-build unit employs CMOS ICs"; Electronics Australia, Jan. 1978; pp. 48-51.
Duncan, et al; "A Semi-Automatic Disco Cross-Fader"; Practical Electronics; Jan. 1980; p. 38.
Arthur, P.R.; "Automatic Fader"; Radio & Electronics Constructor; Sep. 1976; pp. 91-93.

* cited by examiner

*Primary Examiner*—Vivian Chin
*Assistant Examiner*—Disler Paul
(74) *Attorney, Agent, or Firm*—Lee & Hayes, PLLC

(57) ABSTRACT

A request is received to play a first audio file and a second audio file. A system identifies a first effective start position and a fade-out position associated with the first audio file. The system also identifies a second effective start position associated with the second audio file. The first audio file is played from the first effective start position. When the fade-out position associated with the first audio file is reached, playback of the first audio file is faded-out while the second audio file is played from the second effective start position.

37 Claims, 8 Drawing Sheets

METHOD AND APPARATUS FOR PLAYBACK OF AUDIO FILES

RELATED APPLICATIONS

The present application is a Continuation In Part of Ser. No. 10/606,464, filed Jun. 26, 2003 now U.S. Pat. No. 7,272,235, entitled "Method and Apparatus for Audio Normalization", the disclosure of which is incorporated by reference herein.

TECHNICAL FIELD

The systems and methods described herein relate to fading-in one audio file while fading-out another audio file.

BACKGROUND

Computer systems are being used today to store various types of media, such as audio data, video data, combined audio and video data, and streaming media from online sources. A user of a computer system can play audio data through the computer system using, for example, a media player application. Multiple audio files (e.g., songs or music tracks) may be played sequentially. As playback of a first audio file nears the end of the file, the audio file fades out (e.g., the playback volume of the first audio file gradually decreases to silence). As the first audio file fades out, playback of a second audio file (i.e., the next audio data file in the sequence) fades-in. During fade-in, the playback volume of the second audio file gradually increases from silence to the audio file's full volume.

Different audio files have varying amounts of silence at the beginning and ending of the audio files. These periods of silence may vary from less than a second to many seconds in length. Such variable periods of silence from one audio file to the next create problems when attempting to fade-in and fade-out audio files in the manner discussed above. For example, if an audio file fades-in over a period of five seconds and the audio file has six seconds of silence at the beginning of the file, the entire fade-in period will be silent. In another example, if an audio file fades-out over a period of five seconds and the audio file has four seconds of silence at the end of the file, the fade-out period is effectively reduced to one second (since the remaining four seconds are silent). Thus, these variable periods of silence may interfere with fade-in and/or fade-out of audio files. Inconsistent fade-in and/or fade-out of audio files can be annoying to a listener and disturbs their listening enjoyment.

Accordingly, it is desirable to provide an audio playback mechanism that fades-in and/or fades-out non-silent portions of the audio files.

SUMMARY

The systems and methods described herein provide for the fading-in of one audio file while fading-out another audio file. In a particular embodiment, a request is received to play a first audio file and a second audio file. The systems and methods identify a first effective start position and a fade-out position associated with the first audio file. The systems and methods also identify a second effective start position associated with the second audio file. The first audio file is played from the first effective start position. When playback of the first audio file reaches the fade-out position associated with the first audio file, payback of the first audio file is faded-out while the second audio file is played from the second effective start position.

BRIEF DESCRIPTION OF THE DRAWINGS

Similar reference numbers are used throughout the figures to reference like components and/or features.

FIG. 6 is a graph illustrating the manner in which a first audio file fades-out and a second audio file fades-in.

DETAILED DESCRIPTION

The systems and methods discussed herein relate to fading-in one audio file while fading-out another audio file. The fading-in of one audio file while fading-out another audio file may also be referred to as "blending" or "cross-fading" two audio files. The systems and methods described identify effective start positions and effective end positions for each audio file. The effective start positions and effective end positions reduce or eliminate playback of silent portions during the fade-in and fade-out of each audio file. These systems and methods provide a more consistent and uniform fade-in and fade-out of audio files, thereby enhancing the listening experience.

The systems and methods described herein can be applied during, for example, media playback, media recording (e.g., "burning" a CD or DVD) and media scanning or analysis. In a specific embodiment, a fade-in and/or a fade-out process is applied across multiple audio files during playback. As discussed herein, various fade-in and fade-out parameters can be calculated at different times, such as during playback of an audio file, when copying an audio file, when scanning a media library, or during media recording.

As used herein, the term "media clip" describes any sequence of audio data, video data, combined audio and video data, etc. A "media clip" may also be referred to as an "audio clip", a "video clip", or a "song". As used herein, the term "audio file" describes any sequence of audio data having any length. An "audio file" may contain other information in addition to audio data, such as configuration information, associated video data, and the like. An "audio file" may also be referred to as a "media file".

Although particular examples discussed herein refer to playing or copying audio data from CDs, the systems and methods described herein can be applied to any audio data obtained from any source, such as CDs, DVDs (digital video disks or digital versatile disks), video tapes, audio tapes and various online sources. The audio data processed by the systems and methods discussed herein may be stored in any format, such as a raw audio data format or a compressed format such as WMA (Windows Media Audio), MP3 (MPEG, audio layer 3), WAV (a format for storing sound in files; uses ".wav" filename extension), WMV (Windows Media Video), or ASF (Advanced Streaming Format).

Figure 1:
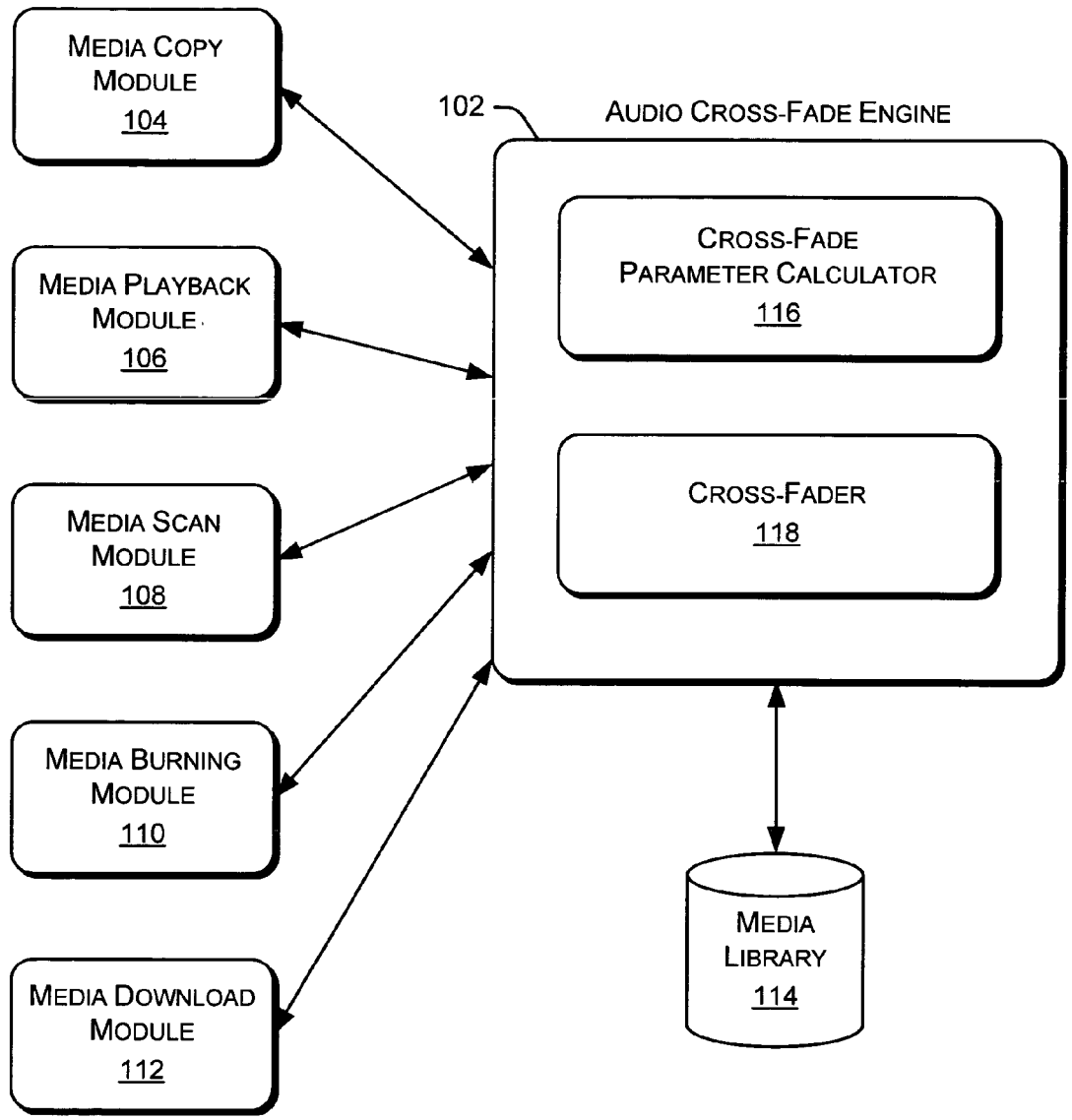
FIG. 1 is a block diagram illustrating an example of various components that can be used to fade-in and fade-out playback of audio files.

FIG. 1 is a block diagram illustrating an example of various components that can be used to fade-in and fade-out playback of audio files. The various components shown in FIG. 1 may be included in a media player application such as the Windows Media® Player available from Microsoft Corporation of Redmond, Wash. An audio cross-fade engine 102 is coupled to a media copy module 104, a media playback module 106, a media scan module 108, a media burning module 110 and a media download module 112. Audio cross-fade engine 102 fades-in and fades-out volume levels for multiple audio files. Media copy module 104 allows a user to copy an audio file from, for example, a CD to a computer hard drive (or other storage device) such that the audio file can be played back through the computer's speakers. This process of copying an audio file from a CD to a computer hard drive is commonly referred to as "ripping". Media copy module 104 may also allow a user to copy an audio file from a computer hard drive to a portable device, such as a WMA or MP3 player.

Media playback module 106 plays audio and/or video data from a CD, DVD, computer hard drive, or other source. Typically, media player module 106 plays audio data through a computer's speakers and plays video data on the computer's monitor. Media scan module 108 scans storage devices coupled to a computer system for audio and/or video files and categorizes those audio and/or video files. Media scan module 108 is typically executed when a media player is installed on a new computer or when a user wants to update a listing of all audio and/or video files on the computer. Media scan module 108 generally scans hard drives, CD-ROM drives, DVD drives, other drives containing removable media, and any portable devices coupled to the computer.

Media burning module 110 controls the recording of data (such as audio and video data) on a recordable media, such as a recordable CD or a recordable DVD. The process of recording a CD or a DVD is commonly referred to as "burning" a CD or DVD. Media burning module 110 may record data from multiple sources onto a single CD or DVD. For example, a collection of audio data stored on a CD may be from another CD, an online source, and from an audio track on a DVD.

Media download module 112 allows users to download media content from various sources, such as web sites, music download services, or data storage mechanisms accessible via, for example, a data communication network. As media content is downloaded by media download module 112, various fade-in and fade-out parameters are computed and saved.

Audio cross-fade engine 102 is also coupled to a media library 114, which stores, for example, fade-in and fade-out parameters associated with multiple audio files. Additional details regarding these parameters are discussed below. Media library 114 may also contain configuration information, audio data, video data, and other data used by audio cross-fade engine 102 and the media player application.

Audio cross-fade engine 102 includes a cross-fade parameter calculator 116 and a cross-fader 118. Cross-fade parameter calculator 116 analyzes audio data and calculates one or more fade-in and/or fade-out parameters (also referred to as "cross-fade parameters") that are applied to the audio data during playback such that one audio file fades out as the next audio file fades in. These parameters are stored in media library 114 along with an identifier of the audio data with which the parameters are associated. The cross-fade parameters are applied by cross-fader 118 during playback of the audio data to cross-fade the audio data. Cross-fader 118 may work in combination with media playback module 106 to cross-fade audio data.

As shown in FIG. 1, media copy module 104, media playback module 106, media scan module 108, media burning module 110 and media download module 112 are coupled to audio cross-fade engine 102. Certain modules 104-112 may interact with cross-fade parameter calculator 116 and/or cross-fader 118 in engine 102. In one embodiment, all five modules 104-112 are coupled to cross-fade parameter calculator 116, while media playback module 106 and media burning module 110 are also coupled to cross-fader 118.

Figure 2:
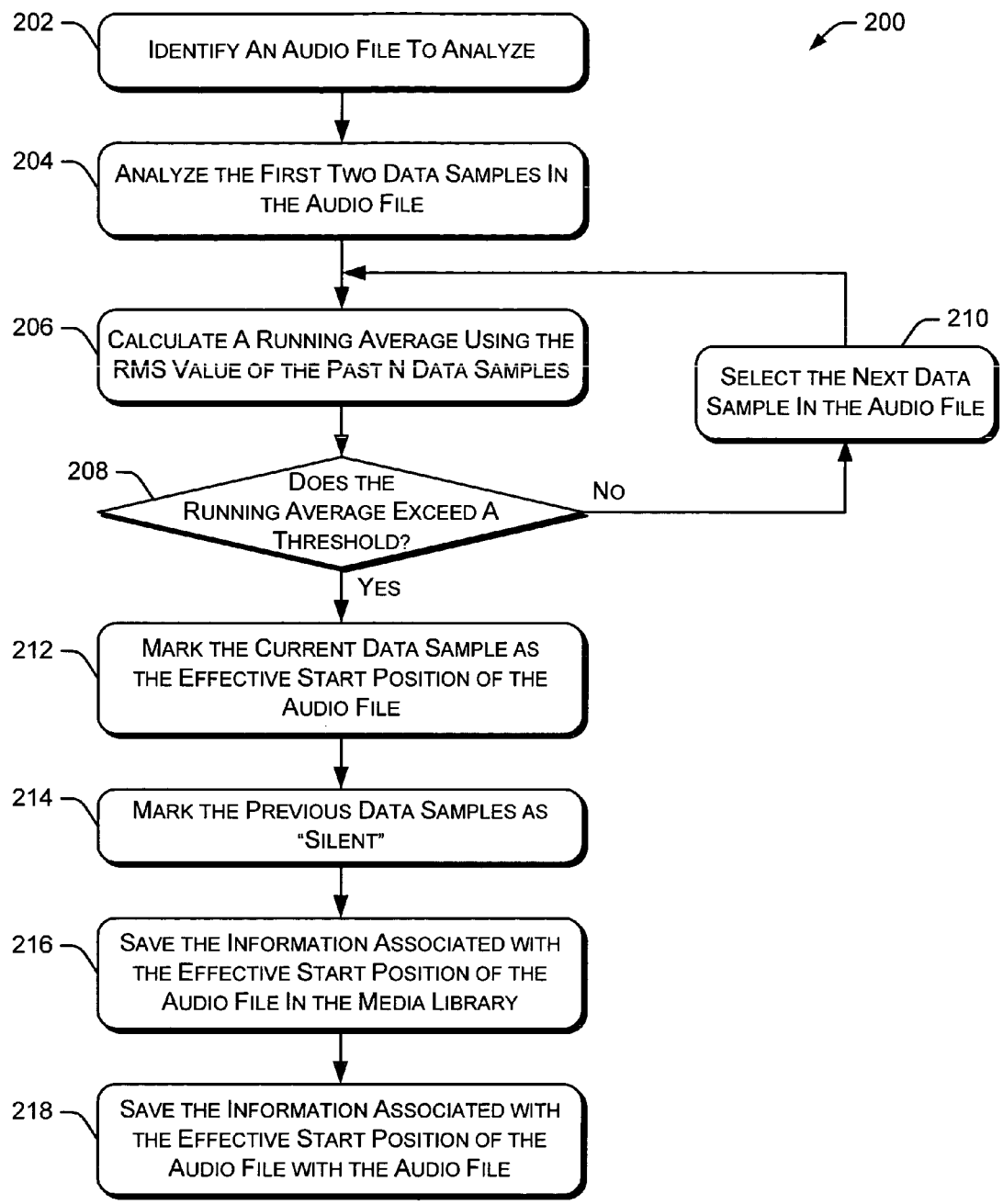
FIG. 2 is a flow diagram illustrating an embodiment of a procedure for determining an effective start position of an audio file.

FIG. 2 is a flow diagram illustrating an embodiment of a procedure 200 for determining an effective start position of an audio file. Initially, an audio file is identified to be analyzed (block 202). The procedure 200 then analyzes the first two data samples in the audio file (block 204). A typical audio file may contain thousands or millions of data samples when using a typical data sampling rate of 44,000 samples per second. The procedure then calculates a running average of the past N data samples by calculating a RMS value (block 206). The value of "i" represents the index for a particular sample. In one embodiment, the running average is computed as:

$$T_i = \sqrt{\frac{\sum_{k=i-N+1}^{i} x_k^2}{N}}$$

The procedure then determines whether the running average exceeds a threshold value (block 208). The threshold value is calculated by first calculating an average value across the entire media clip (e.g., during the calculation discussed above) and using a fraction of that average value as the threshold value. In a particular embodiment, 1% of the average value is used as the threshold value. If the running average does not exceed the threshold value, the procedure selects the next data sample in the audio file (block 210) and returns to block 206 to calculate a new running average that includes the data sample selected in block 210.

When the running average exceeds the threshold value at block 208, the procedure marks the current data sample as the effective start position of the audio file (block 212). All previous data samples are marked as "silent" (block 214). This marking of data samples can be implemented, for example, by identifying at time position within the audio file at which the data samples are no longer considered "silent". Any future processing of the audio file will treat all data samples from the beginning of the audio file to the identified time position as "silent".

Another embodiment first filters the data samples to eliminate frequencies inaudible to humans, thereby leaving the portion of the audio signal that can be heard by human ears. The energy of the filtered audio signal is then calculated and a threshold is used to determine whether particular data samples are "silent". In another embodiment, a system or method calculates or estimates the background noise level in the audio signal. When the magnitude of the data samples is less than (or equal to) the background noise level, those data samples are marked as "silent".

The information associated with the effective start position of the audio file is saved in the media library (block 216) and saved with the audio file (block 218). Thus, the threshold value mentioned above filters out data samples that are silent or nearly silent. Filtering these data samples eliminates or reduces silent playback during fade-in of the audio file.

Saving the effective start position information "with the audio file" includes editing the audio file to include the information or storing the information in another file adjacent to or associated with the audio file. In one embodiment, the effective start position information is stored in a header of the audio file. In certain situations, the audio file cannot be edited and the information cannot be stored with the audio file. In these situations, the audio cross-fade engine relies on the effective start position information stored in the media library during playback of the audio file.

Figure 3:
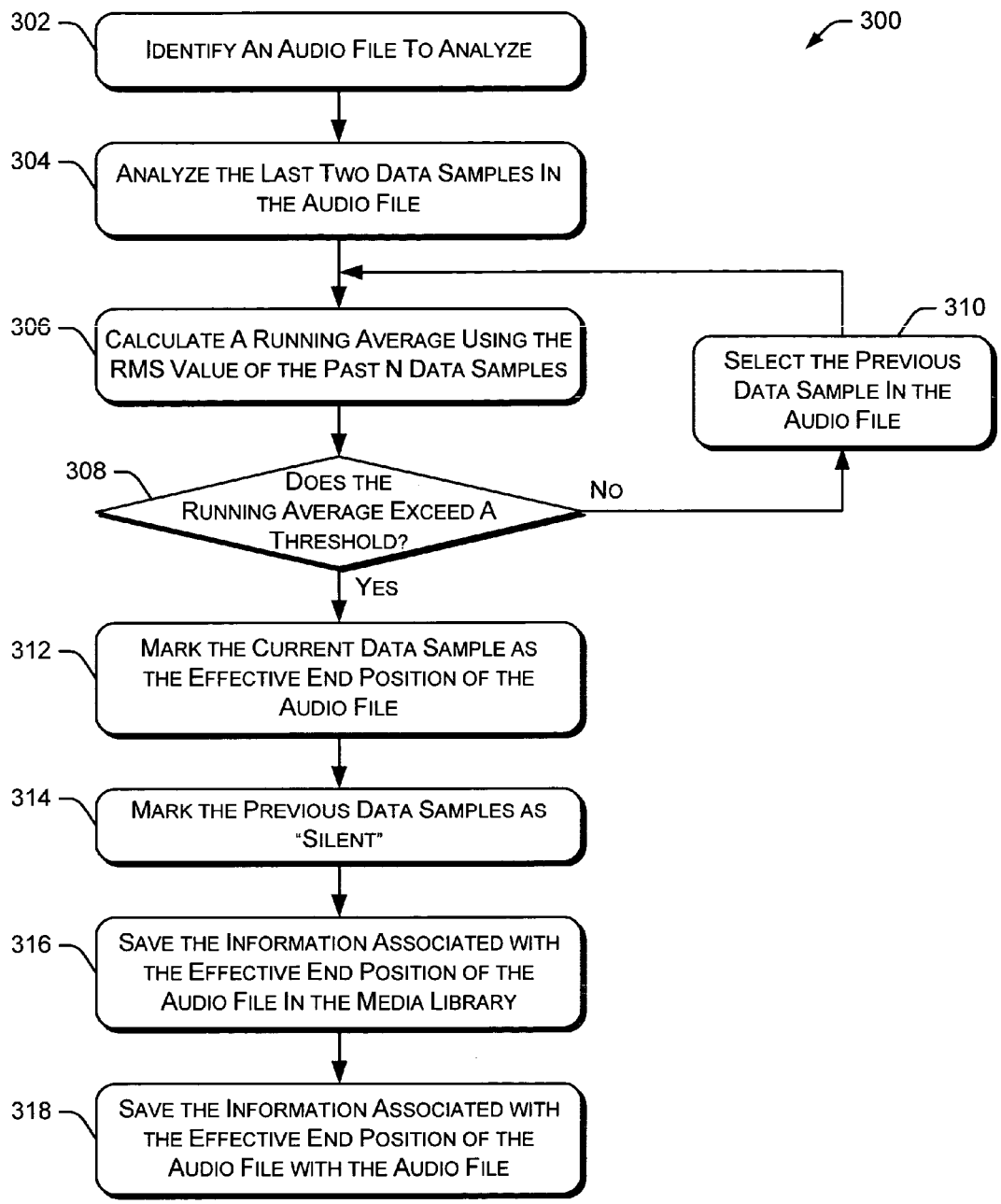
FIG. 3 is a flow diagram illustrating an embodiment of a procedure for determining an effective end position of an audio file.

FIG. 3 is a flow diagram illustrating an embodiment of a procedure 300 for determining an effective end position of an audio file. Initially, an audio file is identified to be analyzed (block 302). The procedure 300 then analyzes the last two data samples in the audio file (block 304). The procedure calculates a running average of the past N data samples by calculating a RMS value (block 306). In one embodiment, the running average is computed using the formula discussed above with respect to FIG. 2.

The procedure then determines whether the running average exceeds a threshold value (block 308). In one embodiment, the threshold value used in this determination is the same threshold value discussed above with respect to block 208 (FIG. 2). If the running average does not exceed the threshold value, the procedure selects the previous data sample (i.e., moving backwards) in the audio file (block 310) and returns to block 306 to calculate a new running average that includes the data sample selected in block 310.

When the running average exceeds the threshold value at block 308, the procedure marks the current data sample as the effective end position of the audio file (block 312). All previous data samples (i.e., data samples between the current data sample and the end of the audio file) are marked as "silent" (block 314). The information associated with the effective end position of the audio file is saved in the media library (block 316) and saved with the audio file (block 318). Thus, the threshold value mentioned above filters out data samples that are silent or nearly silent. Filtering these data samples eliminates or reduces silent playback during fade-out of the audio file.

As discussed above with respect to FIG. 2, saving the effective end position information "with the audio file" includes editing the audio file to include the information or storing the information in another file adjacent to or associated with the audio file. In one embodiment, the effective end position information is stored in a header of the audio file.

The procedures discussed above with respect to FIG. 2 and FIG. 3 may be performed independently or along with another procedure. For example, when copying an audio file to a hard disk drive or other storage device, the procedures of FIG. 2 and FIG. 3 may be performed along with the process of copying the audio file. Thus, the effective start position and the effective end position can be stored with the copied audio file for use by a media player application during playback of the copied audio file.

Figure 4A:
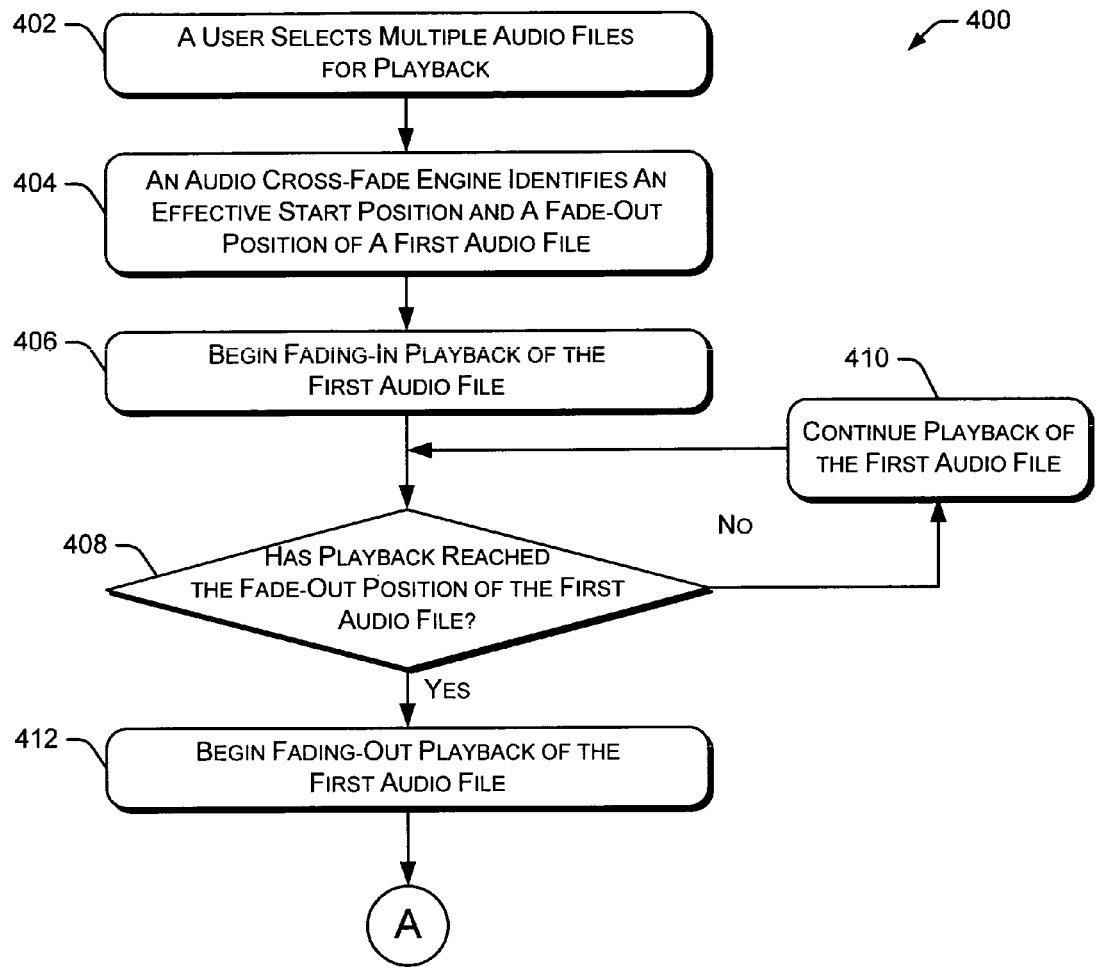
FIGS. 4A and 4B are flow diagrams illustrating an embodiment of a procedure for fading-in and fading-out audio files.
Figure 4B:
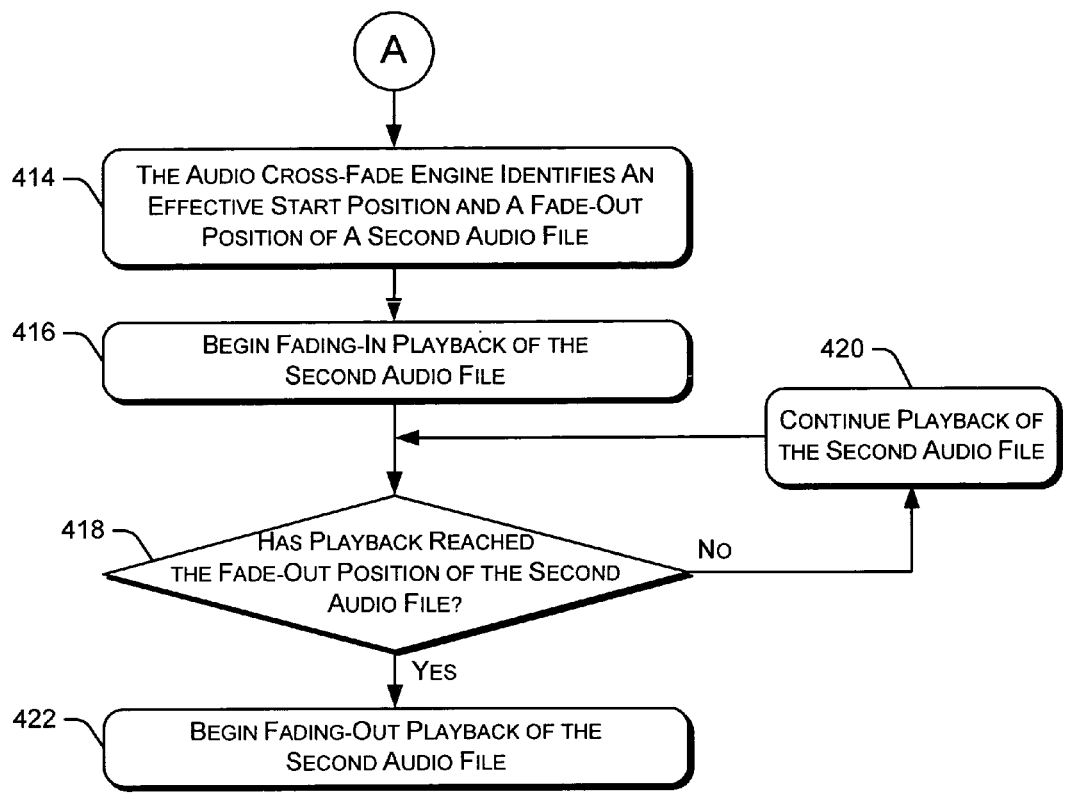

FIGS. 4A and 4B are flow diagrams illustrating an embodiment of a procedure for fading-in and fading-out audio files. Initially, a user selects multiple audio files for playback (block 402). For example, a user may select multiple files individually, may select an album containing multiple songs, or may select a playlist containing multiple songs. An audio cross-fade engine identifies an effective start position and a fade-out position of a first audio file (block 404). The fade-out position of the first audio file can be determined using the effective end position of the audio file and the duration of the fade-out process. For example, if the effective end position of the first audio file is 3:26 (three minutes and 26 seconds) from the effective start position of the first audio file and the duration of the fade-out process is five seconds, the fade-out position for the first audio file is 3:21 (3:26-5 seconds). Thus, if the first audio file begins fading out at 3:21, it will be completely faded out at 3:26 (the effective end position of the first audio file). The examples discussed herein assume that the duration of the fade-out process is five seconds. Similarly, the examples discussed herein assume that the duration of the fade-in process is also five seconds. In alternate embodiments, the duration of the fade-in process and the duration of the fade-out process can be any time period. In particular embodiments, the duration of the fade-in process matches the duration of the fade-out process. However, in other embodiments, the duration of the fade-in process may be longer or shorter than the duration of the fade-out process.

In a particular embodiment, the volume level of the audio file fades-in or fades out in a linear manner. For example, if the fade-in period is five seconds, the volume fades-in from zero to the full volume linearly during the five second period. In alternate embodiments, another function, such as an exponential function, is used to fade-in and/or fade-out the volume level.

Referring again to FIG. 4A, procedure 400 begins fading-in playback of the first audio file (block 406). The procedure then determines whether playback of the first audio file has reached the fade-out position (block 408). If not, the procedure continues playing the first audio file (block 410) until the fade-out position is reached. When playback of the first audio file reaches the fade-out position, the procedure begins fading-out playback of the first audio file (block 412).

Referring to FIG. 4B, as the first audio file begins fading-out, the audio cross-fade engine identifies an effective start position and a fade-out position of a second audio file (block 414). The procedure then begins fading-in playback of the second audio file (block 416). Thus, playback of the second audio file fades-in as playback of the first audio file fades-out.

The procedure continues by determining whether playback of the second audio file has reached the fade-out position (block 418). If not, the procedure continues playing the second audio file (block 420) until the fade-out position is reached. When playback of the second audio file reaches the fade-out position, the procedure begins fading-out playback of the second audio file (block 422). If a third audio file is to be played after the second audio file, playback of the third audio file would be handled in the same manner as the second audio file selected above. This process continues until all selected audio files have been played.

Although FIGS. 4A and 4B show the fading-out of a first audio file and the fading-in of a second audio file as sequential operations, the fading-out of one audio file and the fading-in of another audio file are typically performed simultaneously. For example, block 412 (FIG. 4A) may be performed in parallel with blocks 414 and 416 (FIG. 4B). These fade-in and fade-out operations may be performed by cross-fader 118 (FIG. 1).

Figure 5:
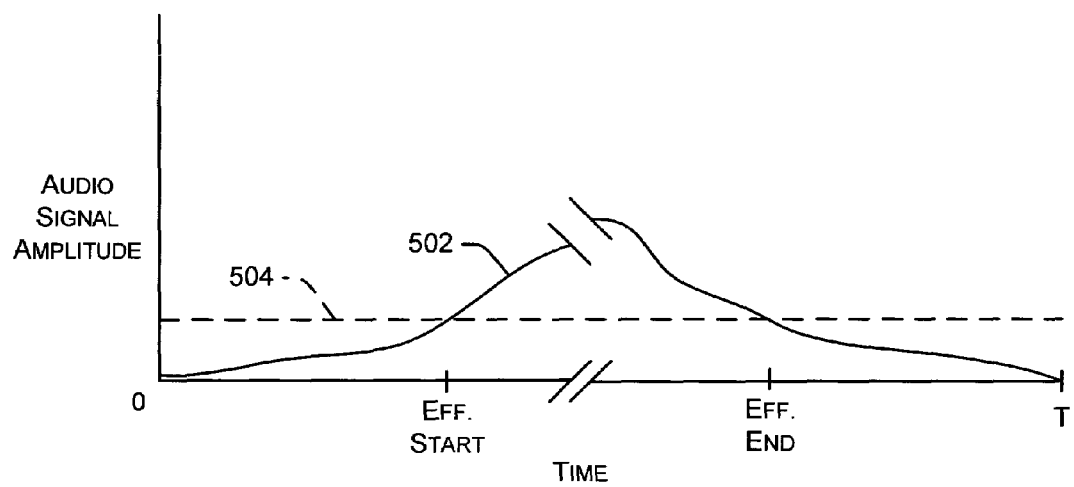
FIG. 5 is a graph illustrating an effective start position and an effective end position associated with a particular audio file.

FIG. 5 is a graph illustrating an effective start position and an effective end position associated with a particular audio file. The audio file is identified by reference designator 502 and begins at Time=0 and ends at Time=T. Broken line 504 represents a threshold amplitude that is used to determine the effective start position and the effective end position of the audio file. Using this threshold amplitude eliminates playback of portions of the audio file that are silent or nearly silent. As shown in FIG. 5, the effective start position of the audio file occurs when the audio file amplitude crosses threshold 504 and the effective end position of the audio file occurs when the audio file amplitude again crosses threshold 504.

In another embodiment (such as the embodiment discussed above with respect to FIG. 2 and FIG. 3), a running average is calculated using audio file data samples. When the running average crosses threshold 504, the effective start position (or the effective end position) is identified.

In another embodiment, the effective start position (or the effective end position) is identified when a predetermined number of consecutive audio file data samples exceed (or fall below) the threshold value. Alternatively, the effective start position (or the effective end position) can be identified when the audio file amplitude stays above a threshold value for a predetermined amount of time (e.g., one second) or falls below the threshold value for a predetermined amount of time.

In FIG. 5, the same threshold value 504 is used to determine the effective start position and the effective end position. In alternate embodiments, different threshold values may be used to determine the effective start position and the effective end position of the audio file.

Figure 6:
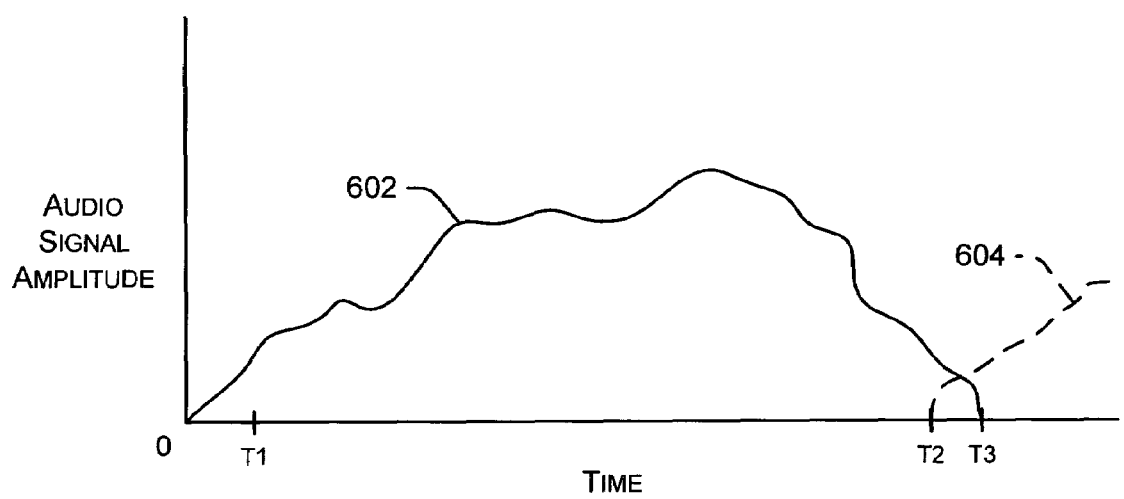

FIG. 6 is a graph illustrating the manner in which a first audio file fades-out and a second audio file fades-in. The first audio file is identified by reference number 602 and the second audio file is shown as a broken line and is identified by reference number 604. In FIG. 6, Time=0 represents the effective start position of the first audio file. The time between Time=0 and Time=T1 represents the fade-in period of the first audio file. Time T2 is the effective start position of the second audio file. Time T3 is the effective end position of the first audio file. The time between Time=T1 and Time=T2 represents the fade-out period of the first audio file as well as the fade-in period of the second audio file.

In a particular embodiment, a user may create (e.g., "burn") an audio CD with one or more audio tracks. The cross-fade system attempts to retrieve fade-in and fade-out parameters from the media library and from the audio files to be recorded on the CD. If these parameters are not available for a particular audio file, the cross-fade system scans the audio file and calculates these parameters. The cross-fade system then scans the audio file a second time to copy the audio file to the CD while applying the parameters calculated during the first scan of the audio file. The resulting audio CD contains one or more audio files that include the necessary fade-in and fade-out parameters.

In another embodiment, a user may download one or more audio files from an online source, such as an online music download service. As the audio files are downloaded, the cross-fade system attempts to retrieve fade-in and fade-out parameters from the media library and from the audio files being downloaded. If these parameters are not available for a particular audio file, the cross-fade system scans the audio file and calculates the parameters as the file is downloaded. The cross-fade system then saves the fade-in and fade-out parameters in the media library and/or in the downloaded audio file.

The systems and methods discussed herein calculate fade-in and fade-out parameters at various times, such as during CD ripping, media scans, and the first time a particular media file is played by the computer system. These parameters are applied in real-time during playback of the audio data. In many cases, the fade-in and fade-out parameters are stored in or stored with the associated audio file. Therefore, if the audio file is copied to a new computer system, the parameters are readily available to the new computer system without requiring any additional analysis or calculations. However, certain audio files are read-only and/or are stored on a read-only media (such as a CD-ROM disc). In this situation, the fade-in and fade-out parameters associated with the audio files are available from the media library.

Figure 7:
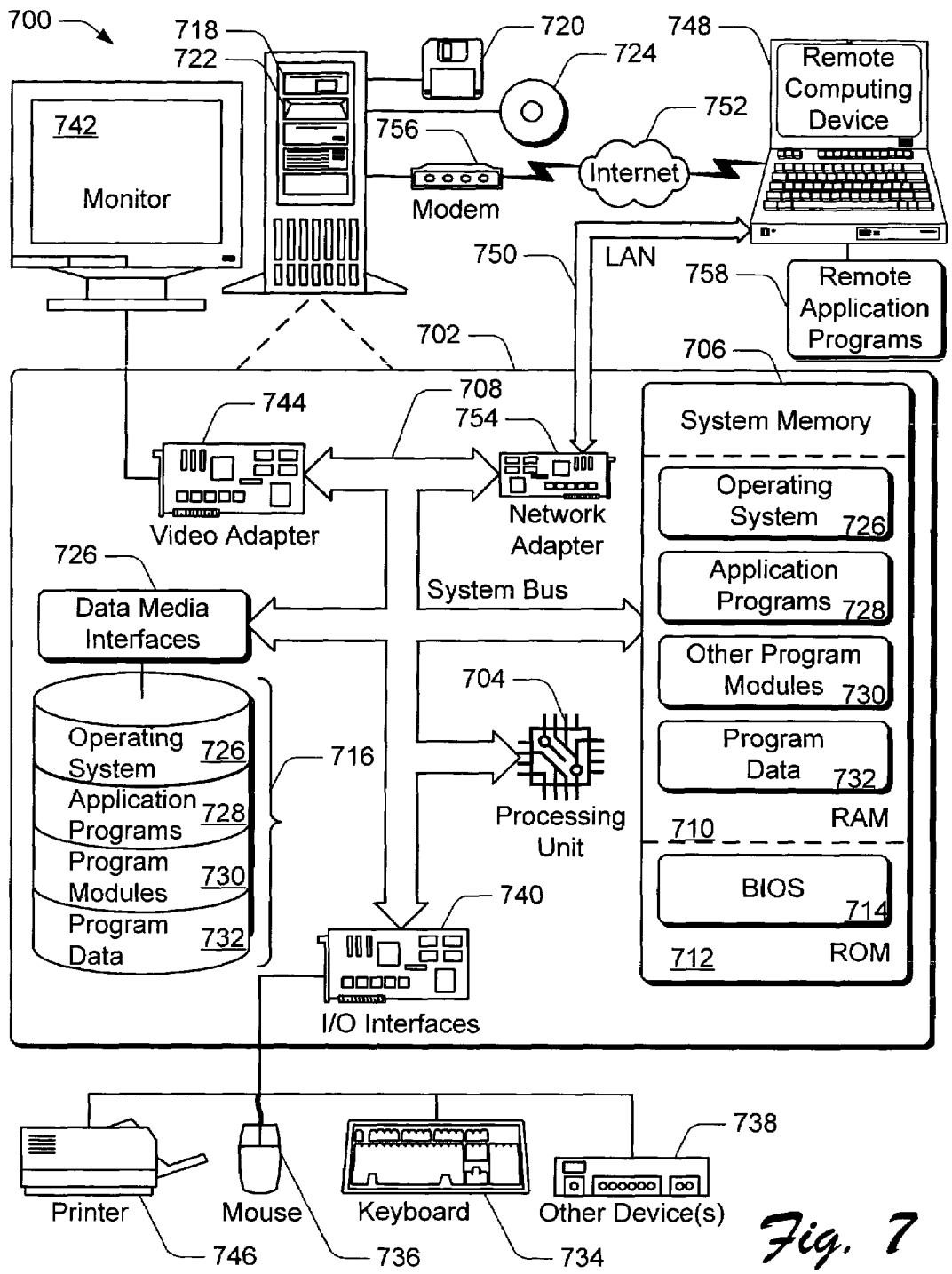
FIG. 7 illustrates a general computer environment, which can be used to implement the techniques described herein.

FIG. 7 illustrates a general computer environment 700, which can be used to implement the techniques described herein. The computer environment 700 is only one example of a computing environment and is not intended to suggest any limitation as to the scope of use or functionality of the computer and network architectures. Neither should the computer environment 700 be interpreted as having any dependency or requirement relating to any one or combination of components illustrated in the example computer environment 700.

Computer environment 700 includes a general-purpose computing device in the form of a computer 702. One or more media player applications can be executed by computer 702. The components of computer 702 can include, but are not limited to, one or more processors or processing units 704 (optionally including a cryptographic processor or co-processor), a system memory 706, and a system bus 708 that couples various system components including the processor 704 to the system memory 706.

The system bus 708 represents one or more of any of several types of bus structures, including a memory bus or memory controller, a peripheral bus, an accelerated graphics port, and a processor or local bus using any of a variety of bus architectures. By way of example, such architectures can include an Industry Standard Architecture (ISA) bus, a Micro Channel Architecture (MCA) bus, an Enhanced ISA (EISA) bus, a Video Electronics Standards Association (VESA) local bus, and a Peripheral Component Interconnects (PCI) bus also known as a Mezzanine bus.

Computer 702 typically includes a variety of computer readable media. Such media can be any available media that is accessible by computer 702 and includes both volatile and non-volatile media, removable and non-removable media.

The system memory 706 includes computer readable media in the form of volatile memory, such as random access memory (RAM) 710, and/or non-volatile memory, such as read only memory (ROM) 712. A basic input/output system (BIOS) 714, containing the basic routines that help to transfer information between elements within computer 702, such as during start-up, is stored in ROM 712. RAM 710 typically contains data and/or program modules that are immediately accessible to and/or presently operated on by the processing unit 704.

Computer 702 may also include other removable/non-removable, volatile/non-volatile computer storage media. By way of example, FIG. 7 illustrates a hard disk drive 716 for reading from and writing to a non-removable, non-volatile magnetic media (not shown), a magnetic disk drive 718 for reading from and writing to a removable, non-volatile magnetic disk 720 (e.g., a "floppy disk"), and an optical disk drive 722 for reading from and/or writing to a removable, non-volatile optical disk 724 such as a CD-ROM, DVD-ROM, or other optical media. The hard disk drive 716, magnetic disk drive 718, and optical disk drive 722 are each connected to the system bus 708 by one or more data media interfaces 726. Alternatively, the hard disk drive 716, magnetic disk drive 718, and optical disk drive 722 can be connected to the system bus 708 by one or more interfaces (not shown).

The disk drives and their associated computer-readable media provide non-volatile storage of computer readable instructions, data structures, program modules, and other data for computer 702. Although the example illustrates a hard disk 716, a removable magnetic disk 720, and a removable optical disk 724, it is to be appreciated that other types of computer readable media which can store data that is accessible by a computer, such as magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like, can also be utilized to implement the example computing system and environment.

Any number of program modules can be stored on the hard disk 716, magnetic disk 720, optical disk 724, ROM 712, and/or RAM 710, including by way of example, an operating system 726, one or more application programs 728, other program modules 730, and program data 732. Each of such operating system 726, one or more application programs 728, other program modules 730, and program data 732 (or some combination thereof) may implement all or part of the resident components that support the distributed file system.

A user can enter commands and information into computer 702 via input devices such as a keyboard 734 and a pointing device 736 (e.g., a "mouse"). Other input devices 738 (not shown specifically) may include a microphone, joystick, game pad, satellite dish, serial port, scanner, and/or the like. These and other input devices are connected to the processing unit 704 via input/output interfaces 740 that are coupled to the system bus 708, but may be connected by other interface and bus structures, such as a parallel port, game port, or a universal serial bus (USB).

A monitor 742 or other type of display device can also be connected to the system bus 708 via an interface, such as a video adapter 744. In addition to the monitor 742, other output peripheral devices can include components such as speakers (not shown) and a printer 746 which can be connected to computer 702 via the input/output interfaces 740.

Computer 702 can operate in a networked environment using logical connections to one or more remote computers, such as a remote computing device 748. By way of example, the remote computing device 748 can be a personal computer, portable computer, a server, a router, a network computer, a peer device or other common network node, game console, and the like. The remote computing device 748 is illustrated as a portable computer that can include many or all of the elements and features described herein relative to computer 702.

Logical connections between computer 702 and the remote computer 748 are depicted as a local area network (LAN) 750 and a general wide area network (WAN) 752. Such networking environments are commonplace in offices, enterprise-wide computer networks, intranets, and the Internet.

When implemented in a LAN networking environment, the computer 702 is connected to a local network 750 via a network interface or adapter 754. When implemented in a WAN networking environment, the computer 702 typically includes a modem 756 or other means for establishing communications over the wide network 752. The modem 756, which can be internal or external to computer 702, can be connected to the system bus 708 via the input/output interfaces 740 or other appropriate mechanisms. It is to be appreciated that the illustrated network connections are exemplary and that other means of establishing communication link(s) between the computers 702 and 748 can be employed.

In a networked environment, such as that illustrated with computing environment 700, program modules depicted relative to the computer 702, or portions thereof, may be stored in a remote memory storage device. By way of example, remote application programs 758 reside on a memory device of remote computer 748. For purposes of illustration, application programs and other executable program components such as the operating system are illustrated herein as discrete blocks, although it is recognized that such programs and components reside at various times in different storage components of the computing device 702, and are executed by the data processor(s) of the computer.

Various modules and techniques may be described herein in the general context of computer-executable instructions, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

An implementation of these modules and techniques may be stored on or transmitted across some form of computer readable media. Computer readable media can be any available media that can be accessed by a computer. By way of example, and not limitation, computer readable media may comprise "computer storage media" and "communications media."

"Computer storage media" includes volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

"Communication media" typically embodies computer readable instructions, data structures, program modules, or other data in a modulated data signal, such as carrier wave or other transport mechanism. Communication media also includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also included within the scope of computer readable media.

Although the description above uses language that is specific to structural features and/or methodological acts, it is to be understood that the invention defined in the appended claims is not limited to the specific features or acts described. Rather, the specific features and acts are disclosed as exemplary forms of implementing the invention.

The invention claimed is:

1. A method comprising:

receiving, by a media player, a request to play a first recorded audio file and a second audio file;

selecting a first data sample and a second data sample in the first audio file;

calculating an average output value of the first two data samples in the first audio file;

if the average value in the first audio file exceeds a threshold value, marking the second data sample as an effective start position associated with the first audio file and marking the first data sample as silent;

if the average value does not exceed the threshold value:

selecting subsequent data samples in the first audio file and updating the average value of all selected data samples until the average value exceeds a threshold value;

selecting the last two data samples in the first audio file;

calculating an average value of the last two data samples in the first audio file;

if the average value exceeds a threshold value, marking the second data sample as an effective start of fade-out position-associated with the first audio file and marking the first data sample as silent;
if the average value does not exceed the threshold value:
selecting subsequent data samples in the first audio file and updating the average value of all selected data samples until the average value exceeds a threshold value;
selecting the first two data samples in the second audio file;
calculating an average value of the first two data samples in the second audio file;
if the average value exceeds a threshold value, marking the second data sample as an effective start position associated with the second audio file and marking the first data sample as silent;
if the average value does not exceed the threshold value:
selecting subsequent data samples in the second audio file and updating the average value of all selected data samples until the average value exceeds a threshold value;
playing the first audio file beginning at the effective start position associated with the first audio file;
upon reaching the effective start of fade-out position associated with the first audio file:
fading-out playback of the first audio file; and
while fading-out playback of the first audio file, simultaneously fading-in playback of the second audio file beginning at the effective start position associated with the second audio file.

2. A method as recited in claim 1 wherein the fade-out position associated with the first audio file is located a predetermined time ahead of an effective end position associated with the first audio file.

3. A method as recited in claim 1 wherein the effective start position associated with the first audio file differs from an actual start position of the first audio file.

4. A method as recited in claim 1 further comprising fading-out playback of the second audio file upon reaching a fade-out position associated with the second audio file.

5. A method as recited in claim 1 wherein the effective start position associated with the first audio file and the fade-out position associated with the first audio file are stored in a media library.

6. A method as recited in claim 1 wherein the effective start position associated with the first audio file and the fade-out position associated with the first audio file are stored in the first audio file.

7. One or more computer-readable memories containing a computer program that is executable by a processor to per-form the method recited in claim 1.

8. A method comprising:
Receiving, by an audio cross-fade engine, a request to analyze an audio file;
selecting the first two data samples in the audio file;
calculating an average value of the first two data samples in the audio file;
if the average value exceeds a threshold value, marking the second data sample as a effective start position associated with the audio file and marking the first data sample as silent;
if the average value does not exceed the threshold value:
selecting subsequent data samples in the audio file and updating the average value of all selected data samples until the average value exceeds a threshold value;
marking a current data sample as an effective start position associated with the audio file; and
marking previously selected data samples as silent.

9. A method as recited in claim 8 wherein the average value of the data samples is calculated based on volume levels in the audio file.

10. A method as recited in claim 8 further comprising saving the effective start position associated with the audio file to a media library.

11. A method as recited in claim 8 further comprising saving the effective start position associated with the audio file to a storage device that stores the audio file.

12. A method as recited in claim 8 further comprising saving information regarding data samples marked as silent to a storage device that stores the audio file.

13. A method as recited in claim 8 wherein the effective start position is applied during subsequent playback of the audio file.

14. A method as recited in claim 8 wherein the effective start position is applied during subsequent playback of the audio file to determine a point at which the audio file begins to fade-in as a previous audio file fades out.

15. One or more computer-readable memories containing a computer program that is executable by a processor to per-form the method recited in claim 8.

16. A method comprising:
receiving, by an audio cross-fade engine, a request to analyze an audio file;
selecting the last two data samples in the audio file;
calculating an average value of the last two data samples in the audio file;
if the average value exceeds a threshold value, marking the last data sample as an effective end position associated with the audio file and marking the other selected data sample as silent;
if the average value does not exceed the threshold value:
selecting previous data samples in the audio file and updating the average value of all selected data samples until the average value exceeds a threshold value;
marking a current data sample as an effective end position associated with the audio file; and
marking previously selected data samples as silent.

17. A method as recited in claim 16 wherein the method is per-formed by a media player application.

18. A method as recited in claim 16 further comprising saving the effective end position associated with the audio file in a media library.

19. A method as recited in claim 16 further comprising saving the effective end position associated with the audio file to a storage device that stores the audio file.

20. A method as recited in claim 16 wherein the average value of the data samples is calculated based on volume levels in the audio file.

21. A method as recited in claim 16 further comprising saving information regarding data samples marked as silent to a storage device that stores the audio file.

22. A method as recited in claim 16 wherein the effective end position is applied during subsequent playback of the audio file.

23. A method as recited in claim 16 wherein the effective end position is applied during subsequent playback of the audio file to determine a point at which the audio file begins to fade-out.

24. One or more computer-readable memories containing a computer program that is executable by a processor to per-form the method recited in claim 16.

25. An apparatus comprising:
a cross-fade parameter calculator configured to perform acts comprising:
select a first and a second data sample in a first audio file;
calculate an average output value of the first and second data samples in the first audio file;
if the average value exceeds a threshold value, mark the second data sample as an effective start position associated with the first audio file and mark the first data sample as silent;
if the average value does not exceed the threshold value:
select subsequent data samples in the first audio file and update the average value of all selected data samples until the average value exceeds a threshold value; and
select the last two data samples in the first audio file;
calculate an average value of the last two data samples in the first audio file;
if the average value exceeds a threshold value, mark the second data sample as an effective start of fade-out position-associated with the first audio file and mark the first data sample as silent;
if the average value does not exceed the threshold value:
select subsequent data samples in the first audio file and update the average value of all selected data samples until the average value exceeds a threshold value;
a media library coupled to the cross-fade parameter calculator, the media library configured to store fade-out parameters associated with a plurality of audio files, wherein the fade-out parameters are stored separate from the audio files; and
a cross-fader coupled to the media library, the cross-fader configured to apply fade-out parameters during playback of audio files.

26. An apparatus as recited in claim 25 wherein the cross-fade parameter calculator is further configured to calculate an effective start position associated with the first audio file.

27. An apparatus as recited in claim 25 wherein the cross-fade parameter calculator is further configured to calculate an effective end position associated with the first audio file.

28. An apparatus as recited in claim 25 wherein the cross-fader is further configured to retrieve fade-out parameters from the media library.

29. An apparatus comprising:
means for receiving a request to play a first audio file followed by a second audio file;
means for selecting the first two data samples in the first audio file;
means for calculating an average value of the first two data samples in the first audio file;
if the average value exceeds a threshold value, marking the second data sample as an effective start position associated with the first audio file and marking the first data sample as silent;
if the average value does not exceed the threshold value:
selecting subsequent data samples in the first audio file and updating the average value of all selected data samples until the average value exceeds a threshold value;
means for selecting the last two data samples in the first audio file;
means for calculating an average value of the last two data samples in the first audio file;
if the average value exceeds a threshold value, marking the second data sample as an effective start of fade-out position-associated with the first audio file and marking the first data sample as silent;
if the average value does not exceed the threshold value:
selecting subsequent data samples in the first audio file and updating the average value of all selected data samples until the average value exceeds a threshold value;
means for selecting the first two data samples in the second audio file;
means for calculating an average value of the first two data samples in the second audio file;
if the average value exceeds a threshold value, marking the second data sample as an effective start position associated with the second audio file and marking the first data sample as silent;
if the average value does not exceed the threshold value:
means for selecting subsequent data samples in the second audio file and updating the average value of all selected data samples until the average value exceeds a threshold value;
means for playing the first audio file beginning at the first effective start position, wherein upon reaching the fade-out position associated with the first audio file, the means for playing fades-out playback of the first audio file and begins playing the second audio file beginning at the second effective start position.

30. An apparatus as recited in claim 29 wherein the fade-out position is located a predetermined time prior to an effective end position associated with the first audio file.

31. An apparatus as recited in claim 29 wherein the means for playing fades-out playback of the second audio file upon reaching a fade-out position associated with the second audio file.

32. An apparatus as recited in claim 29 wherein the start position associated with the first audio file, the fade-out position associated with the first audio file, and the second effective start position associated with the second audio file are retrieved from a media library.

33. An apparatus as recited in claim 29 wherein the start position associated with the first audio file and the fade-out position associated with the first audio file are retrieved from the first audio file.

34. One or more computer-readable storage media having stored there on a computer program that, when executed by one or more processors, causes the one or more processors to perform a method comprising:
receiving by the one or more processors a request to play a sequence of audio files;
selecting the first two data samples in the first audio file;
calculating an average value of the first two data samples in the first audio file;
if the average value exceeds a threshold value, marking the second data sample as an effective start position associated with the first audio file and marking the first data sample as silent;
if the average value does not exceed the threshold value:
selecting subsequent data samples in the first audio file and updating the average value of all selected data samples until the average value exceeds a threshold value;
selecting the last two data samples in the first audio file;
calculating an average value of the last two data samples in the first audio file;
if the average value exceeds a threshold value, marking the second data sample as an effective start of fade-out position-associated with the first audio file and marking the first data sample as silent;

if the average value does not exceed the threshold value:
  selecting subsequent data samples in the first audio file and updating the average value of all selected data samples until the average value exceeds a threshold value;
selecting the first two data samples in the second audio file;
calculating an average value of the first two data samples in the second audio file;
  if the average value exceeds a threshold value, marking the second data sample as an effective start position associated with the second audio file and marking the first data sample as silent;
if the average value does not exceed the threshold value:
selecting subsequent data samples in the second audio file and updating the average value of all selected data samples until the average value exceeds a threshold value;
playing the first audio file beginning at the effective start position associated with the first audio file;
upon reaching the fade-out position associated with the first audio file:
  fading-out playback of the first audio file; and
  playing the second audio file beginning at the effective start position associated with the second audio file.

35. One or more computer-readable storage media as recited in claim 34 wherein the fade-out position associated with the first audio file is calculated by subtracting a predetermined time period from an effective end position associated with the first audio file.

36. One or more computer-readable storage media as recited in claim 34 wherein the one or more processors further fade-out playback of the second audio file upon reaching a fade-out position associated with the second audio file.

37. One or more computer-readable storage media as recited in claim 34 wherein the one or more processors further calculate effective start positions and fade-out positions associated with each audio file in the sequence of audio files.

* * * * *